US010985127B2

(12) United States Patent
Lee et al.

(10) Patent No.: US 10,985,127 B2
(45) Date of Patent: Apr. 20, 2021

(54) FAN-OUT SEMICONDUCTOR PACKAGE

(71) Applicant: SAMSUNG ELECTRONICS CO., LTD., Suwon-si (KR)

(72) Inventors: Jeong Ho Lee, Suwon-si (KR); Bong Ju Cho, Suwon-si (KR); Young Gwan Ko, Suwon-si (KR); Jin Su Kim, Suwon-si (KR); Shang Hoon Seo, Suwon-si (KR); Jeong Il Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/698,516

(22) Filed: Nov. 27, 2019

(65) Prior Publication Data
US 2020/0126942 A1 Apr. 23, 2020

Related U.S. Application Data

(63) Continuation of application No. 15/988,647, filed on May 24, 2018, now Pat. No. 10,522,497.

(30) Foreign Application Priority Data

Oct. 31, 2017 (KR) .................. 10-2017-0143838

(51) Int. Cl.
*H01L 23/48* (2006.01)
*H01L 23/00* (2006.01)
(Continued)

(52) U.S. Cl.
CPC ............ *H01L 24/25* (2013.01); *H01L 21/481* (2013.01); *H01L 21/4857* (2013.01);
(Continued)

(58) Field of Classification Search
CPC ..... H01L 24/25; H01L 21/56; H01L 21/4857; H01L 2224/24227; H01L 2224/25171
(Continued)

(56) References Cited

U.S. PATENT DOCUMENTS 5,081,563 A 1/1992 Feng
5,157,589 A 10/1992 Cole, Jr.
(Continued)

FOREIGN PATENT DOCUMENTS

JP 2014-150154 A 8/2014
JP 2016-207957 A 12/2016
(Continued)

OTHER PUBLICATIONS

Communication dated Aug. 8, 2019, issued by the Taiwanese Patent Office in counterpart Taiwanese Application No. 107118573.
(Continued)

*Primary Examiner* — Nitin Parekh
(74) *Attorney, Agent, or Firm* — Sughrue Mion, PLLC

(57) ABSTRACT

A fan-out semiconductor package includes: a frame including insulating layers, wiring layers, and connection via layers, and having a recess portion having a stopper layer; a semiconductor chip having connection pads, an active surface on which the connection pads are disposed, and an inactive surface opposing the active surface, and disposed in the recess portion so that the inactive surface is connected to the stopper layer; an encapsulant covering at least portions of the semiconductor chip and filling at least portions of the recess portion; and a connection member disposed on the frame and the active surface of the semiconductor chip and including a redistribution layer electrically connecting the wiring layers of the frame and the connection pads of the semiconductor chip to each other, wherein the stopper layer includes an insulating material.

15 Claims, 16 Drawing Sheets

(51) Int. Cl.
*H01L 21/48* (2006.01)
*H01L 21/56* (2006.01)
*H01L 23/498* (2006.01)
*H01L 23/31* (2006.01)
*H01L 21/683* (2006.01)

(52) U.S. Cl.
CPC .......... *H01L 21/56* (2013.01); *H01L 21/6835* (2013.01); *H01L 23/3128* (2013.01); *H01L 23/49822* (2013.01); *H01L 24/19* (2013.01); *H01L 24/20* (2013.01); *H01L 24/24* (2013.01); *H01L 24/32* (2013.01); *H01L 24/73* (2013.01); *H01L 24/13* (2013.01); *H01L 2221/68359* (2013.01); *H01L 2221/68372* (2013.01); *H01L 2224/13147* (2013.01); *H01L 2224/18* (2013.01); *H01L 2224/24101* (2013.01); *H01L 2224/24227* (2013.01); *H01L 2224/25171* (2013.01); *H01L 2224/25174* (2013.01); *H01L 2224/32227* (2013.01); *H01L 2224/73204* (2013.01); *H01L 2224/73209* (2013.01); *H01L 2224/73267* (2013.01); *H01L 2924/15311* (2013.01); *H01L 2924/3511* (2013.01)

(58) Field of Classification Search
USPC .................................................. 257/700, 758
See application file for complete search history.

(56) References Cited

U.S. PATENT DOCUMENTS

| | | | |
|---|---|---|---|
| 5,565,706 A | 10/1996 | Miura et al. | |
| 6,709,897 B2 | 3/2004 | Cheng | |
| 8,344,492 B2 * | 1/2013 | Chino | H01L 24/19 |
| | | | 257/686 |
| 8,941,230 B2 * | 1/2015 | Kyozuka | H01L 24/24 |
| | | | 257/698 |
| 8,980,691 B2 | 3/2015 | Lin | |
| 9,893,045 B2 | 2/2018 | Pagaila | |
| 2001/0030059 A1 | 10/2001 | Sugaya | |
| 2003/0059976 A1 * | 3/2003 | Nathan | H01L 25/0655 |
| | | | 438/106 |
| 2011/0316147 A1 * | 12/2011 | Shih | H01L 24/97 |
| | | | 257/737 |
| 2012/0313226 A1 * | 12/2012 | Koizumi | H01L 24/19 |
| | | | 257/659 |
| 2012/0319295 A1 | 12/2012 | Chi | |
| 2013/0154072 A1 | 6/2013 | Do et al. | |
| 2013/0171774 A1 | 7/2013 | Chen | |
| 2014/0210109 A1 | 7/2014 | Tanaka et al. | |
| 2014/0264839 A1 * | 9/2014 | Tsai | H01L 23/5384 |
| | | | 257/737 |
| 2015/0061139 A1 | 3/2015 | Yap | |
| 2016/0233166 A1 | 8/2016 | Teh | |
| 2016/0322294 A1 | 11/2016 | Kobayashi | |
| 2016/0338202 A1 | 11/2016 | Park et al. | |
| 2017/0092604 A1 | 3/2017 | Hsieh et al. | |

FOREIGN PATENT DOCUMENTS

| | | |
|---|---|---|
| KR | 10-2015-0038312 A | 4/2015 |
| KR | 10-2016-0132763 A | 11/2016 |
| WO | 2014/051817 A1 | 4/2014 |

OTHER PUBLICATIONS

Office Action issued in corresponding Korean Patent Application No. 10-2017-0143838, dated Jul. 20, 2018.

* cited by examiner

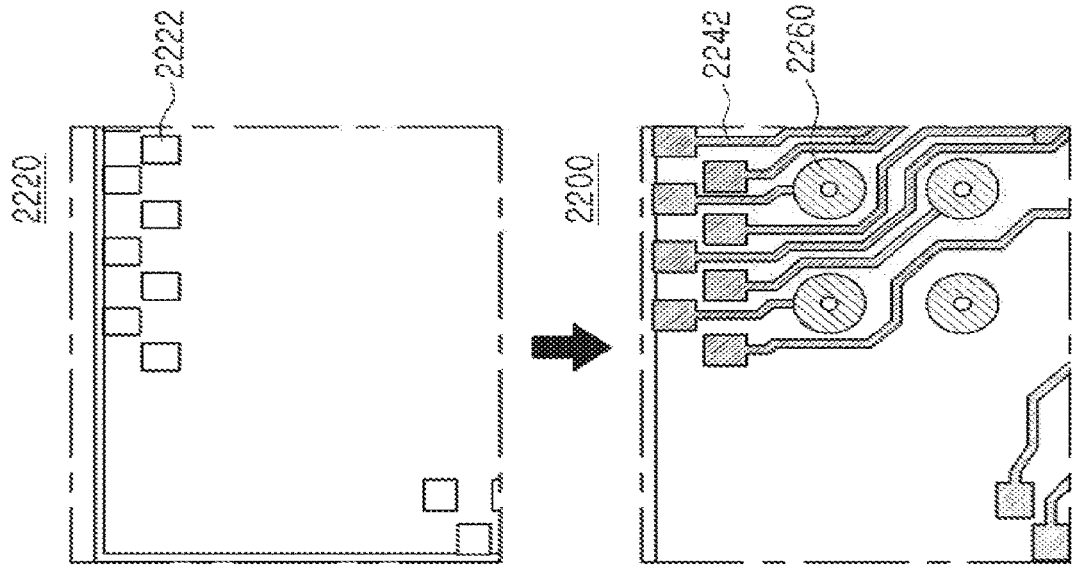
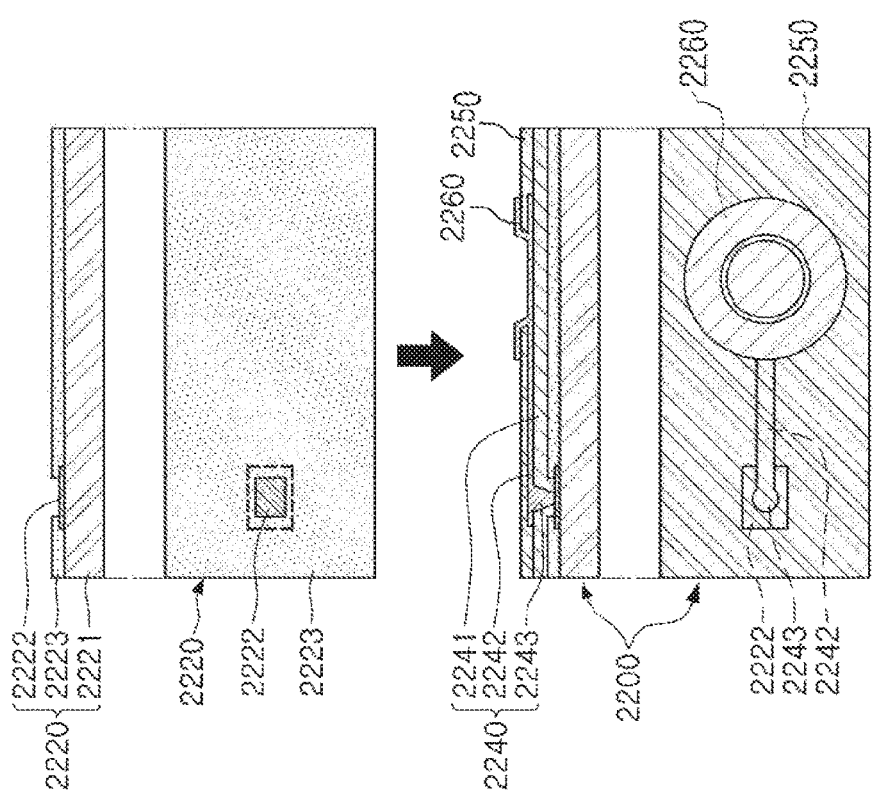
FIG. 3B
FIG. 3A

FAN-OUT SEMICONDUCTOR PACKAGE

CROSS-REFERENCE TO RELATED APPLICATION(S)

This application is a U.S. patent application Ser. No. 15/988,647, filed May 24, 2018, which claims the benefit of priority to Korean Patent Application No. 10-2017-0143838 filed on Oct. 31, 2017, in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package, having a compact size while including a plurality of pins, has been demanded.

One type of semiconductor package technology suggested to satisfy the technical demand, described above, is a fan-out semiconductor package. Such a fan-out package has a compact size and may allow a plurality of pins to be implemented by redistributing connection terminals outwardly of a region in which a semiconductor chip is disposed.

SUMMARY

An aspect of the present disclosure may provide a fan-out semiconductor package in which a frame having a blind recess portion is introduced, a semiconductor chip is disposed in the recess portion, and gradients of walls of the recess portion are controlled to optimize a process.

According to an aspect of the present disclosure, a fan-out semiconductor package may be provided, in which an insulating material is used as a material of a stopper layer for forming a blind recess portion.

According to an aspect of the present disclosure, a fan-out semiconductor package may include: a frame including a plurality of insulating layers, a plurality of wiring layers disposed on the plurality of insulating layers, and a plurality of connection via layers penetrating through the plurality of insulating layers and electrically connecting the plurality of wiring layers to each other, and having a recess portion having a stopper layer disposed on a bottom surface thereof; a semiconductor chip having connection pads, an active surface on which the connection pads are disposed, and an inactive surface opposing the active surface, and disposed in the recess portion so that the inactive surface is connected to the stopper layer; an encapsulant covering at least portions of the semiconductor chip and filling at least portions of the recess portion; and a connection member disposed on the frame and the active surface of the semiconductor chip and including a redistribution layer electrically connecting the plurality of wiring layers of the frame and the connection pads of the semiconductor chip to each other, wherein the stopper layer includes an insulating material.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
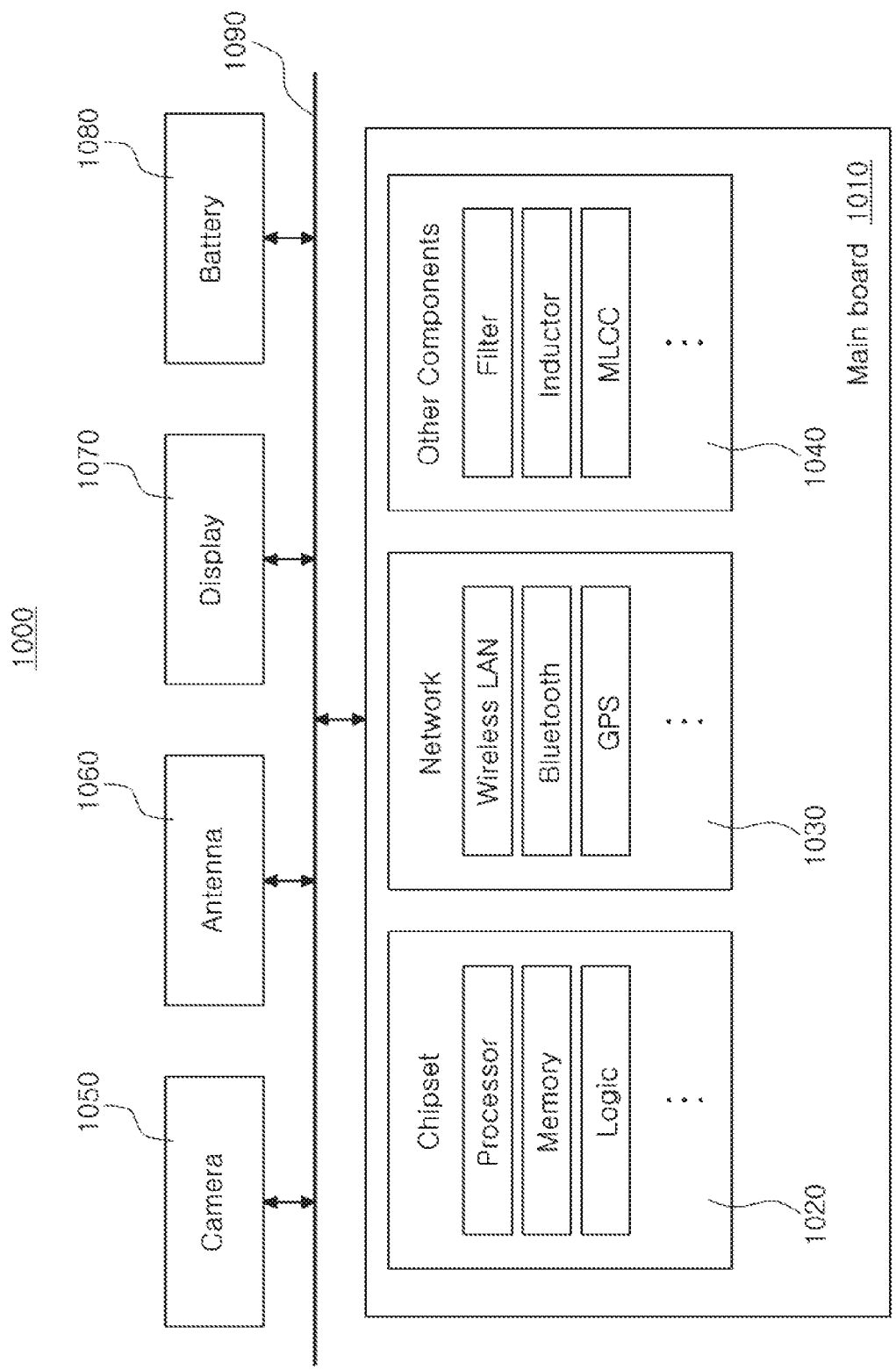
FIG. 1 is a schematic block diagram illustrating an example of an electronic device system.

FIG. 1 is a schematic block diagram illustrating an example 5 of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long termevolution (LTE), evolution data only (Ev-D0), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
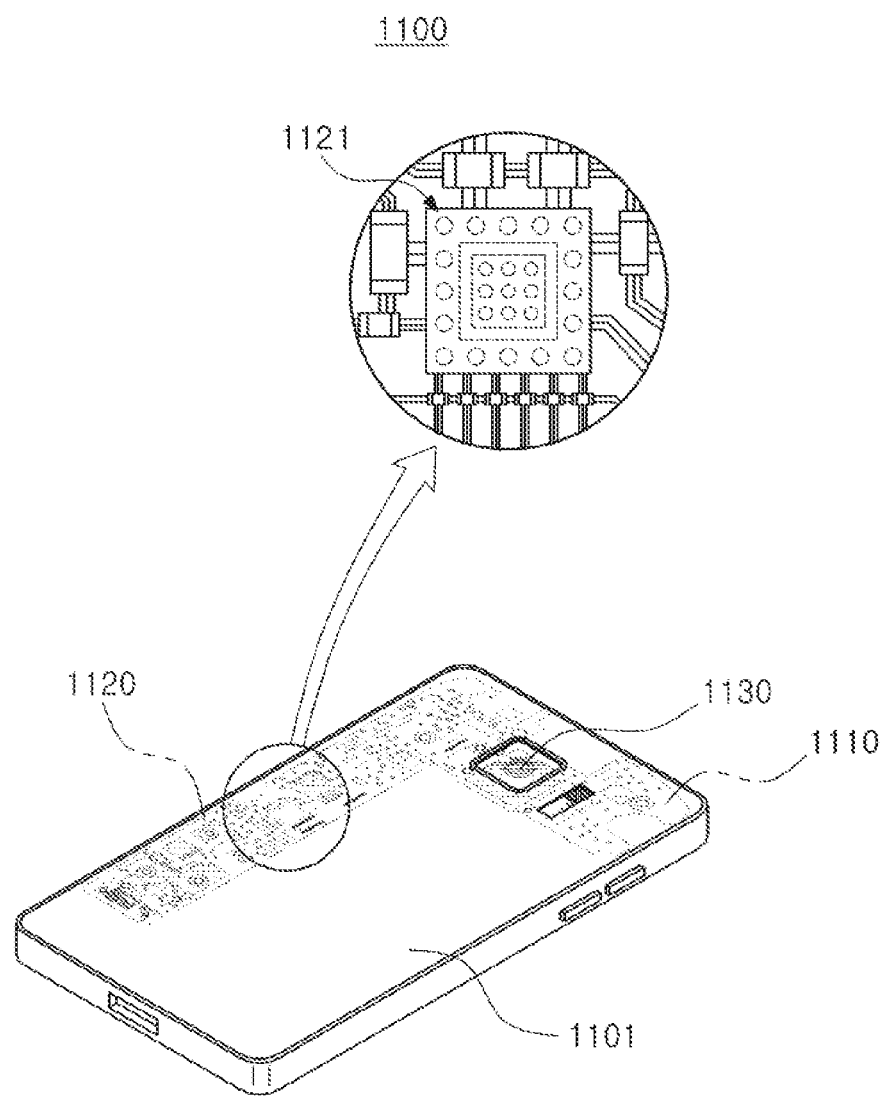
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts.

Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

FIGS. 3A and 3B are schematic cross-sectional views illustrating states of a fan-in semiconductor package before and after being packaged.

Figure 4:
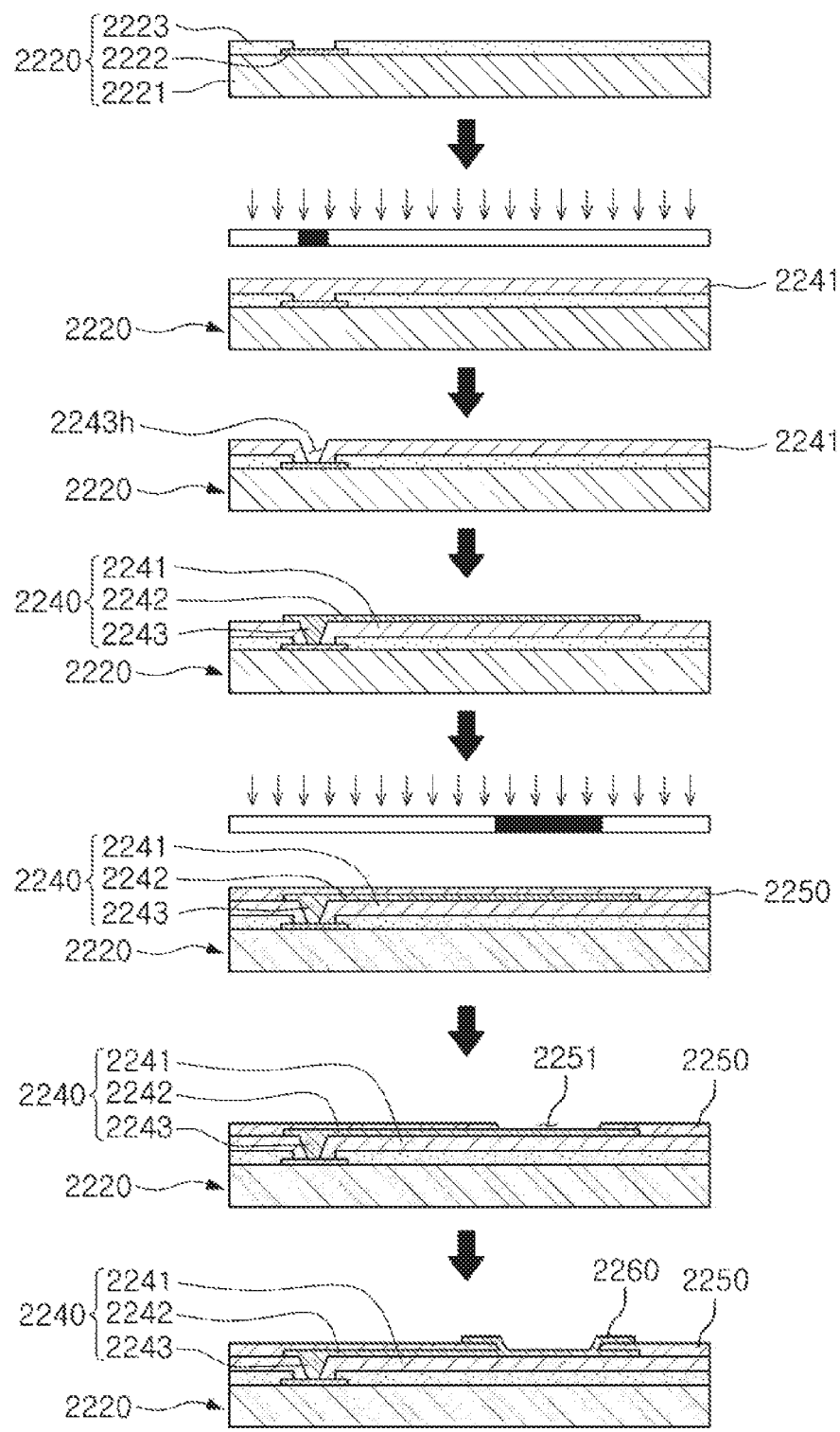
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium. arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using and insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
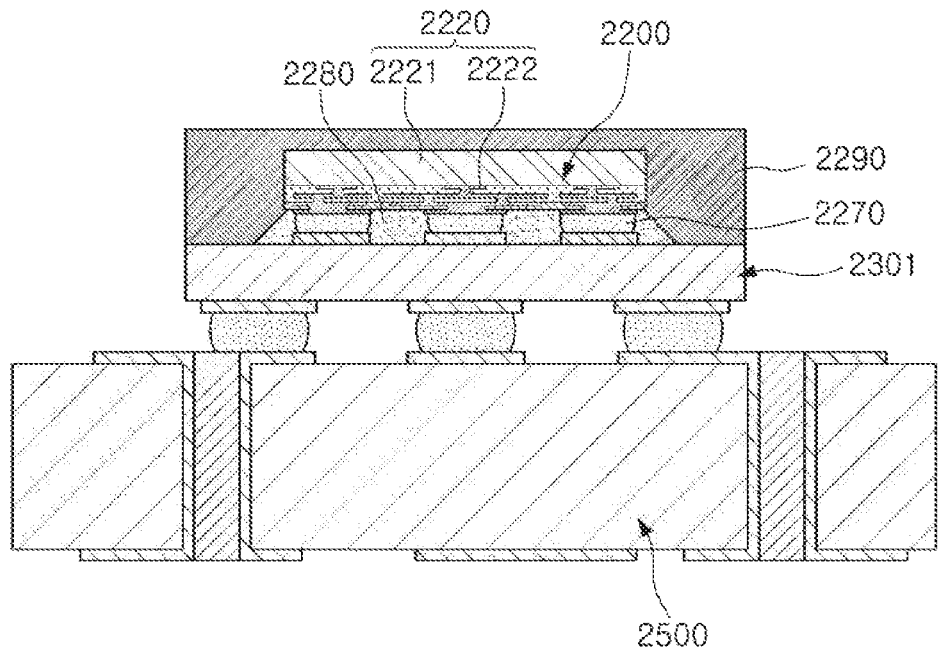
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
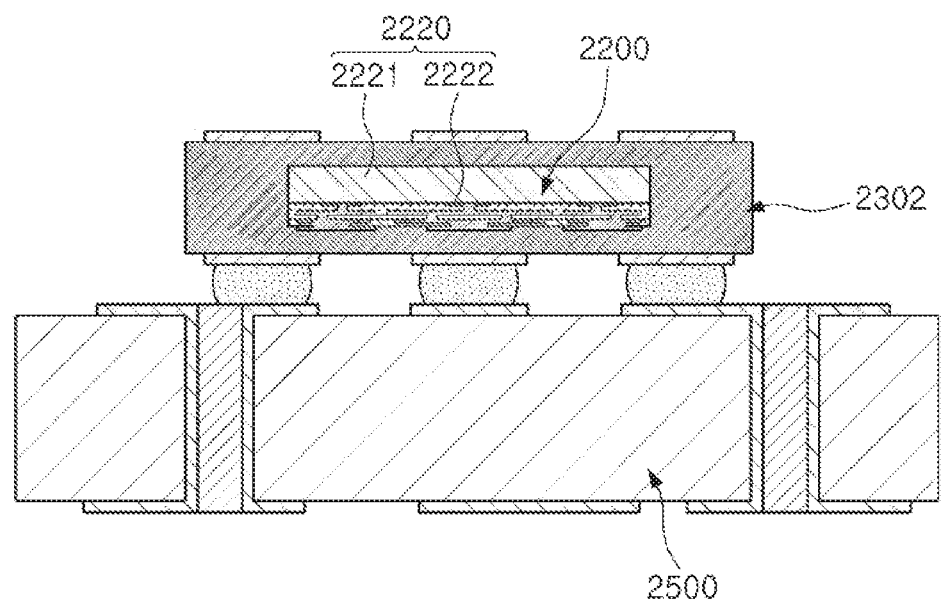
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
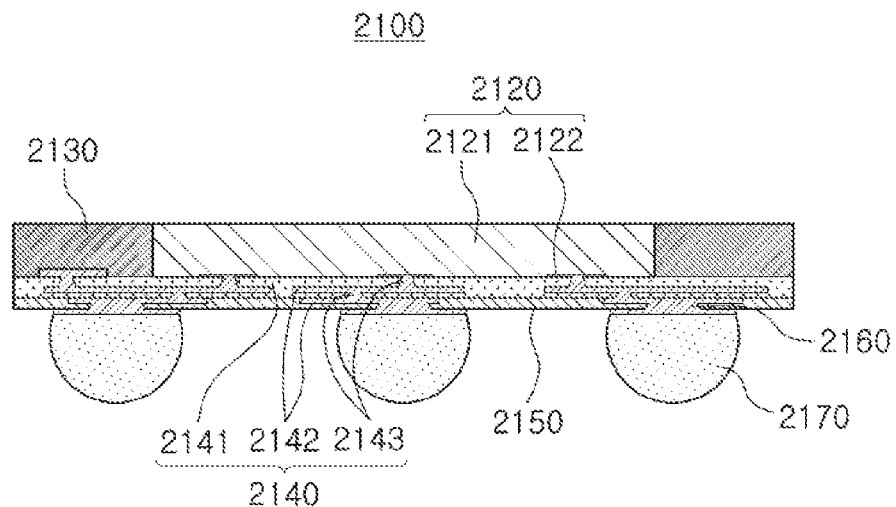
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
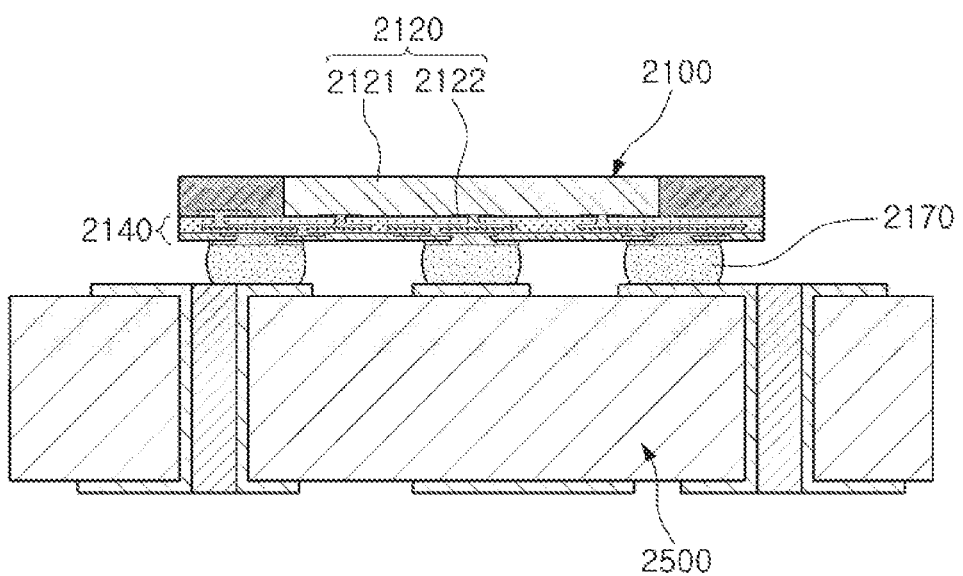
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package in which a frame having a blind recess portion by a stopper layer is introduced will hereinafter be described with reference to the drawings.

Figure 9:
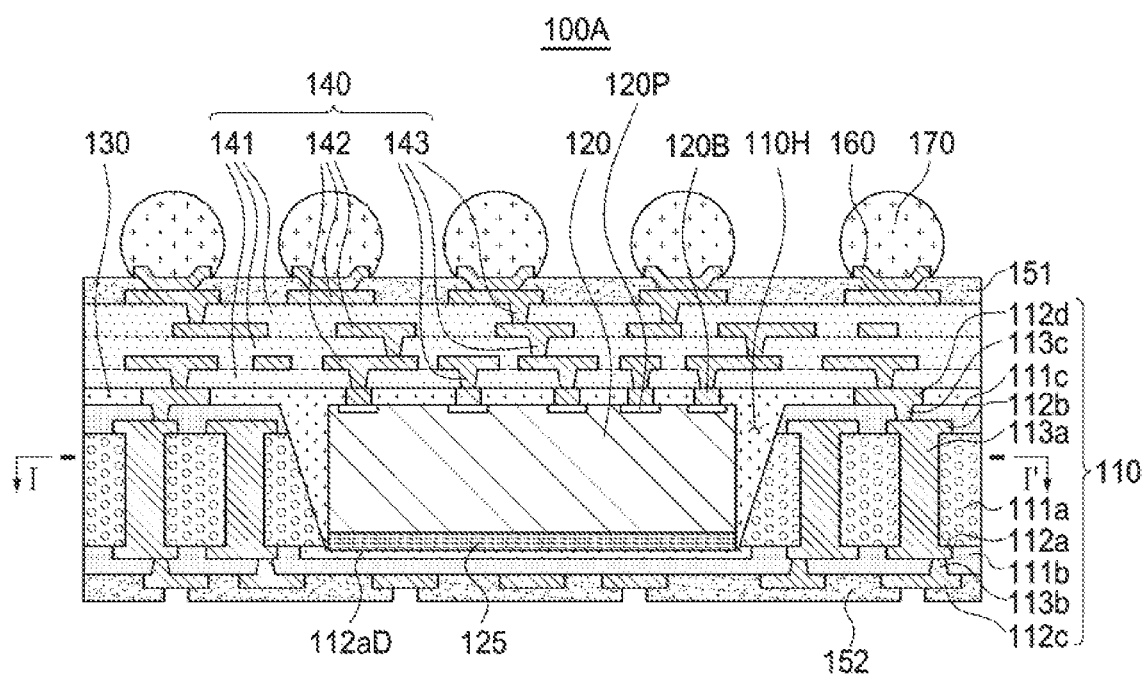
FIG. 9 is a schematic cross-sectional view illustrating an example of a fan-out semiconductor package.

FIG. 9 is a schematic cross-sectional view illustrating an example of a fan-out semiconductor package.

Figure 10:
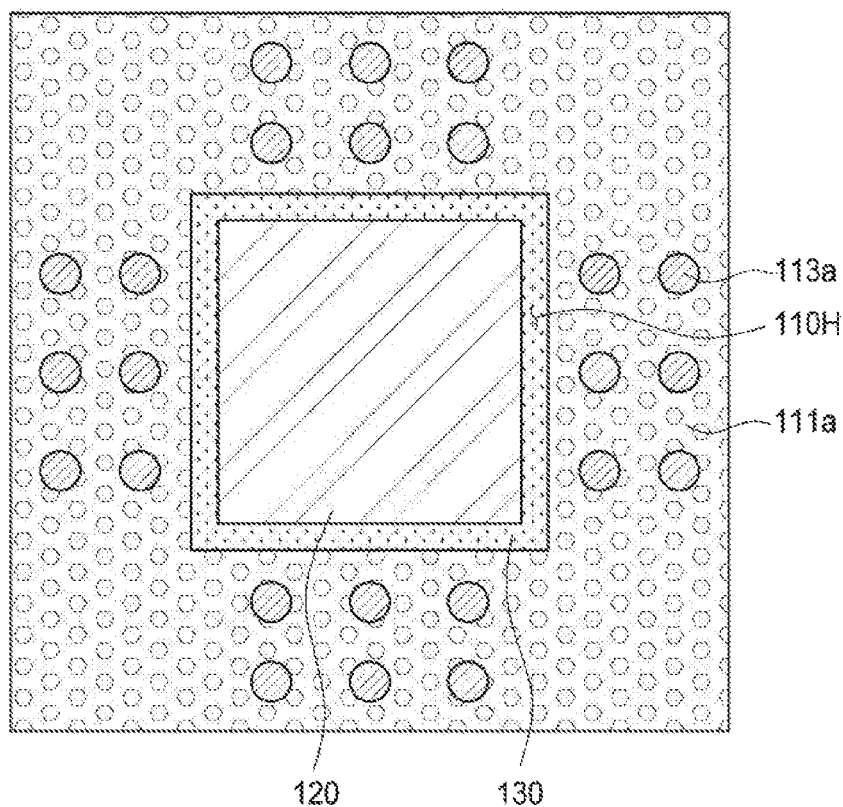
FIG. 10 is a schematic plan view taken along line I-I' of the fan-out semiconductor package of FIG. 9.

FIG. 10 is a schematic plan view taken along line I-I' 5 of the fan-out semiconductor package of FIG. 9.

Referring to FIGS. 9 and 10, a fan-out semiconductor package 100A according to an exemplary embodiment in the present disclosure may include a frame 110 having a recess portion 110H having a blind form of which a first surface is covered with a stopper layer 112aD and a second surface opposing the first surface is opened, a semiconductor chip 120 having an active surface having connection pads 120P disposed thereon and an inactive surface opposing the active surface and disposed in the recess portion 110H so that the inactive surface is attached to the stopper layer 112aD, an encapsulant 130 encapsulating at least portions of each of the frame 110 and the semiconductor chip 120 and filling at least portions of the recess portion 110H, and a connection member 140 disposed on the frame 110 and the active surface of the semiconductor chip 120. The frame 110 may include wiring layers 12a, 112b, 112c, and 112d electrically connected to each other through connection via layers 113a, 113b, and 113c, the connection member 140 may include redistribution layers 142 electrically connected to each other through connection vias 143, and the wiring layers 112a, 112b, 112c, and 112d may be electrically connected to the connection pads 120P of the semiconductor chip 120 through the redistribution layers 142.

In addition, the fan-out semiconductor package 100A according to the exemplary embodiment may further include a first passivation layer 151 disposed on the connection member 140 and having openings exposing at least portions of the redistribution layer 142 of the connection member 140, a second passivation layer 152 disposed on the frame 110 and having openings exposing at least portions of the wiring layer 112c of the frame 110, underbump metal layers 160 disposed in the openings of the first passivation layer 151 and electrically connected to the exposed redistribution layer 142, and electrical connection structures 170 disposed on the underbump metal layers 160 and electrically connected to the exposed redistribution layer 142 through the underbump metal layers 160, if necessary.

Meanwhile, the stopper layer 112aD may include a material having an etching rate lower than that of a metal such as copper (Cu) in a sandblasting process. For example, the stopper layer 112aD may include an insulating material. In more detail, the stopper layer 112aD may be, for example, a dry film photo-resist (DFR) including a photosensitive polymer, but is not limited thereto. The material having a very low etching rate, such as the DFR, may be used as the material of the stopper layer 112aD, such that a process margin may be improved in the sandblasting process. Resultantly, a process may be optimized.

The respective components included in the fan-out semiconductor package 100A according to the exemplary embodiment will hereinafter be described in more detail.

The frame 110 may improve rigidity of the fan-out semiconductor package 100A depending on certain materials, and serve to secure uniformity of a thickness of the encapsulant 130. In addition, the frame 110 may include the wiring layers 112a, 112b, 112c, and 112d, and the connection via layers 113a, 113b, and 113c, and thus serve as a connection member. The frame 110 may include the wiring layer 112c disposed on the inactive surface of the semiconductor chip 120, and thus provide a backside wiring layer for the semiconductor chip 120 without performing a process of forming a separate backside wiring layer. The frame 110 may have the recess portion 110H formed using the stopper layer 112aD as a stopper and having the blind form, and the inactive surface of the semiconductor chip 120 may be attached to the stopper layer 112aD through any known adhesive member 125 such as a die attach film (DAF), or the like. The recess portion 110H may be formed by a sandblasting process as described below. In this case, the recess portion 110H may have a tapered shape. That is, walls of the recess portion 110H may have a predetermined gradient in relation to the stopper layer 112aD. In this case, a process of aligning the semiconductor chip 120 may be easier, and a yield of the semiconductor chip 120 may thus be improved.

The frame 110 may include a first insulating layer 111a, a first wiring layer 112a disposed on a first surface of the first insulating layer 111a, a second wiring layer 112b disposed on a second surface of the first insulating layer 111a, a second insulating layer 111b disposed on the first surface of the first insulating layer 111a and covering the first wiring layer 112a, a third wiring layer 112c disposed on the second insulating layer 111b, a third insulating layer 111c disposed on the second surface of the first insulating layer 111a and covering the second wiring layer 112b, and a fourth wiring layer 112d disposed on the third insulating layer 111c. In addition, the frame 110 may include first connection via layers 113a penetrating through the first insulating layer 111a and electrically connecting the first and second wiring layers 112a and 112b to each other, second connection via layers 113b penetrating through the second insulating layer 111b and electrically connecting the first and third wiring layers 112a and 112c to each other, and third connection via layers 113c penetrating through the third insulating layer 111c and electrically connecting the second and fourth wiring layers 112b and 112d to each other. The first to fourth wiring layers 112a, 112b, 112c, and 112d may be electrically connected to each other, and may be electrically connected to connection pads 120P of the semiconductor chip 120.

The stopper layer 112aD may be disposed on the first surface of the first insulating layer 111a, and a first surface of the stopper layer 112aD may be covered with the second insulating layer 111b and at least portions of a second surface of the stopper layer 112aD opposing the first surface of the stopper layer 112aD may be exposed by the recess portion 110H. The recess portion 110H may penetrate through the first and third insulating layers 111a and 111c, but may not penetrate through the second insulating layer 111b. The walls of the recess portions 10 110H formed in the first and third insulating layers 111a and 111c may have substantially the same gradient. A thickness of an edge region of the stopper layer 112aD in contact with the first insulating layer 111a may be greater than that of a region of the stopper layer 112aD exposed from the first insulating layer 111a 15 by the recess portion 110H. The reason is that portions of the exposed region may also be removed in a sandblasting process.

A material of each of the insulating layers 111a, 111b, and 111c may be an insulating material. In this case, the insulating material may be a thermosetting resin such as an epoxy 20 resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, Ajinomoto Build up Film (ABF), FR-4, Bismaleimide Triazine (BT), or the like. When a material having high rigidity, such as prepreg including a glass fiber, or the like, is used as the material of each of the insulating layers 111a, 111b, and 111c, the frame 110 may be utilized as a support member for controlling warpage of the fan-out semiconductor package 100A.

The first insulating layer 111a may have a thickness greater than those of the second insulating layer 111b and the third insulating layer 111c. The first insulating layer 111a may be basically relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg in which an insulating resin is impregnated together with an inorganic filler in a glass fiber, and the second insulating layer 111b and the third insulating layer 111c may be an ABF or a PID film including an inorganic filler and an insulating resin. However, the materials of the first insulating layer 111a and the second and third insulating layers 111b and 111c are not limited thereto. Similarly, the first connection via layer 113a penetrating through the first insulating layer 111a may have diameter greater than those of the second and third connection via layers 113b and 113c each penetrating through the second and third insulating layers 111b and 111c.

The wiring layers 112a, 112b, 112c, and 112d may redistribute the connection pads 120P of the semiconductor chip 120, and may be electrically connected to the connection pads 120P through the redistribution layers 142. A material of each of the wiring layers 112a, 112b, 112c, and 112d may be a conductive material such as copper (Cu), aluminum (Al), silver (Ag), tin (Sn), gold (Au), nickel (Ni), lead (Pb), titanium (Ti), or alloys thereof. The wiring layers 112a, 112b, 112c, and 112d may perform various functions depending on designs of corresponding layers. For example, the wiring layers 112a, 112b, 112c, and 112d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a, 112b, 112c, and 112d may include various pad patterns.

Thicknesses of the wiring layers 112a, 112b, 112c, and 112d may be greater than those of the redistribution layers 142 of the connection member 140. Since the frame 110 may be formed by a substrate process, the wiring layers 112a, 112b, 112c, and 112d may also be formed to have large sizes. On the other hand, since the connection member 140 may be formed by a semiconductor process, the redistribution layers 142 of the connection member 140 may be formed to have relatively small sizes for thinness.

The connection via layers 113a, 113b, and 113c may electrically connect the wiring layers 112a, 112b, 112c, and 112d formed on different layers to each other, resulting in an electrical path in the frame 110. A material of each of the connection via layers 113a, 113b, and 113c may be a conductive material. Each of the connection via layers 113a, 113b, and 113c may be completely filled with the conductive material, or the conductive material may also be formed along a wall of each of via holes. The first connection via layer 113a may have a cylindrical shape or an hourglass shape, and the second and third connection via layers 113b and 113c may have tapered shapes. In this case, the second and third connection via layers 113b and 113c may have tapered shapes of which directions are opposite to each other in relation to the first insulating layer 111a.

The semiconductor chip 120 may be an integrated circuit (IC) provided in an amount of several hundred to several million or more elements integrated in a single chip. The semiconductor chip 120 may be, for example, a processor chip (more specifically, an application processor (AP)) such as a central processor (for example, a CPU), a graphic processor (for example, a GPU), a field programmable gate array (FPGA), a digital signal processor, a cryptographic processor, a microprocessor, a micro controller, or the like, but is not limited thereto. In addition, the semiconductor chip 120 may be a memory chip such as a volatile memory (such as a DRAM), a non-volatile memory (such as a ROM), a flash memory, or the like, but is not limited thereto.

The semiconductor chip 120 may be formed on the basis of an active wafer, and a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer exposing the connection pads 120P may be formed on the body, and may be an oxide film, a nitride film, or the like, or a double layer of an oxide layer and a nitride layer. An insulating layer, and the like, may also be further disposed in required positions. The semiconductor chip 120 may be a bare die, but may further include a redistribution layer formed on the active surface thereof, if necessary.

The semiconductor chip 120 may include bumps 120B each disposed on the connection pads 120P and connected to the connection pads 120P. Each of the bumps 120B may be formed of a metal such as copper (Cu) or may be formed of a solder. As seen from a process to be described below, the fan-out semiconductor package 100A according to the exemplary embodiment is subjected to a grinding process, and a surface of the fourth wiring layer 112d of the frame 110 connected to the redistribution layer 142 may thus be disposed on the same level as that of a surface of each of the bumps 120B of the semiconductor chip 120 connected to the redistribution layer 142. The same level may conceptually include a fine difference due to a process error. Therefore, a height of the connection via 143 connecting the bump 120B to the redistribution layer 142 and a height of the connection via 143 connecting the fourth wiring layer 112d to the redistribution layer 142 may be the same as each other. The same height may conceptually include a fine difference due to a process error. When a surface on which the connection member 140 is formed is flat, insulating layers 141 may be flatly formed, and the redistribution layers 142, the connection vias 143, or the like, may thus be more finely formed.

The encapsulant 130 may protect the frame 110, the semiconductor chip 120, and the like. An encapsulation form of the encapsulant 130 is not particularly limited, but may be a form in which the encapsulant 130 surrounds at least portions of the frame 110, the semiconductor chip 120, and the like. For example, the encapsulant 130 may cover the frame 110 and the active surface of the semiconductor chip 120, and fill spaces between the walls of the recess portion 110H and side surfaces of the semiconductor chip 120. The encapsulant 130 may fill the recess portion 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a photoimagable encapsulant (PIE) resin may also be used as the insulating material.

The connection member 140 may redistribute the connection pads 120P of the semiconductor chip 120, and may electrically connect the wiring layers 112a, 112b, 112c, and 112d of the frame 110 to the connection pads 120P of the semiconductor chip 120. Several tens to several millions of connection pads 120P of the semiconductor chip 120 having various functions may be redistributed by the connection member 140, and may be physically or electrically externally connected through the electrical connection structures 170 depending on the functions. The connection member 140 may include the insulating layers 141 disposed on the frame 110 and the active surface of the semiconductor chip 120, the redistribution layers 142 disposed on the insulating layers 141, and the connection vias 143 penetrating through the insulating layers 141 and connecting the connection pads 120P, the fourth wiring layer 112d, and each of the redistribution layers 142 to each other. The numbers of insulating layers, redistribution layers, via layers of the connection member 140 may be more than or less than those illustrated in the drawing.

A material of each of the insulating layers 141 may be an insulating material. In this case, a photosensitive insulating material such as a PID resin may also be used as the insulating material. That is, each of the insulating layers 141 may be a photosensitive insulating layer. When the insulating layer 141 has photosensitive properties, the insulating layer 141 may be formed to have a smaller thickness, and a fine pitch of the connection via 143 may be achieved more easily. Each of the insulating layers 141 may be a photosensitive insulating layer including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 120P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include various pad patterns, and the like.

The connection vias 143 may electrically connect the redistribution layers 142, the connection pads 120P, and the fourth wiring layer 112d, and the like, formed on different layers to each other, resulting in an electrical path in the fan-out semiconductor package 100A. A material of each of the connection vias 143 may be a conductive material such as copper (Cu), aluminum (Al), silver (Ag), tin (Sn), gold (Au), nickel (Ni), lead (Pb), titanium (Ti), or alloys thereof. Each of the connection vias 143 may be completely filled with the conductive material, or the conductive material may also be formed along a wall of each of the connection vias. In addition, each of the connection vias 143 may have a tapered shape, or the like.

The first passivation layer 151 may protect the connection member 140 from external physical or chemical damage. The first passivation layer 151 may have the openings exposing at least portions of the redistribution layer 142 of the connection member 140. The number of openings formed in the first passivation layer 151 may be several tens to several millions. A material of the first passivation layer 151 is not particularly limited. For example, an insulating material may be used as the material of the first passivation layer 151. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The second passivation layer 152 may protect the frame 110 from external physical or chemical damage. The second passivation layer 152 may have the openings exposing at least portions of the third wiring layer 112c of the frame 110. The number of openings formed in the second passivation layer 152 may be several tens to several millions. A material of the second passivation layer 152 is not particularly limited. For example, an insulating material may be used as the material of the second passivation layer 152. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a solder resist may also be used.

The underbump metal layers 160 may improve connection reliability of the electrical connection structures 170 to improve board level reliability of the fan-out semiconductor package 100A. The underbump metal layers 160 may be connected to the redistribution layer 142 of the connection member 140 exposed through the openings of the first passivation layer 151. The underbump metal layers 160 may be formed in the openings of the first passivation layer 151 by any known metallization method using any known conductive material such as a metal, but are not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be suitably modified depending on design particulars. For example, the electrical connection structures 170 may be provided in an amount of several tens to several thousands according to the number of connection pads 120P, or may be provided in an amount of several tens to several thousands or more or several tens to several thousands or less. When the electrical connection structures 170 are solder balls, the electrical connection structures 170 may cover side surfaces of the underbump metal layers 160 extending onto one surface of the first passivation layer 151, and connection reliability may be more excellent.

At least one of the electrical connection structures 170 may be disposed in a fan-out region. The fan-out region refers to a region except for a region in which the semiconductor chip 120 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the recess portion 110H, if necessary, in order to dissipate heat or block electromagnetic waves. In addition, a plurality of semiconductor chips 120 performing functions that are the same as or different from each other may be disposed in the recess portion 110H, if necessary. In addition, a separate passive component such as an inductor, a capacitor, or the like, may be disposed in the recess portion 110H, if necessary. In addition, passive components, for example, surface mounting technology (SMT) components including an inductor, a capacitor, or the like, may be disposed on surfaces of the first and second passivation layers 151 and 152, if necessary.

FIGS. 11A through 11D are schematic views illustrating processes of manufacturing the fan-out semiconductor package of FIG. 9.

Figure 11A:
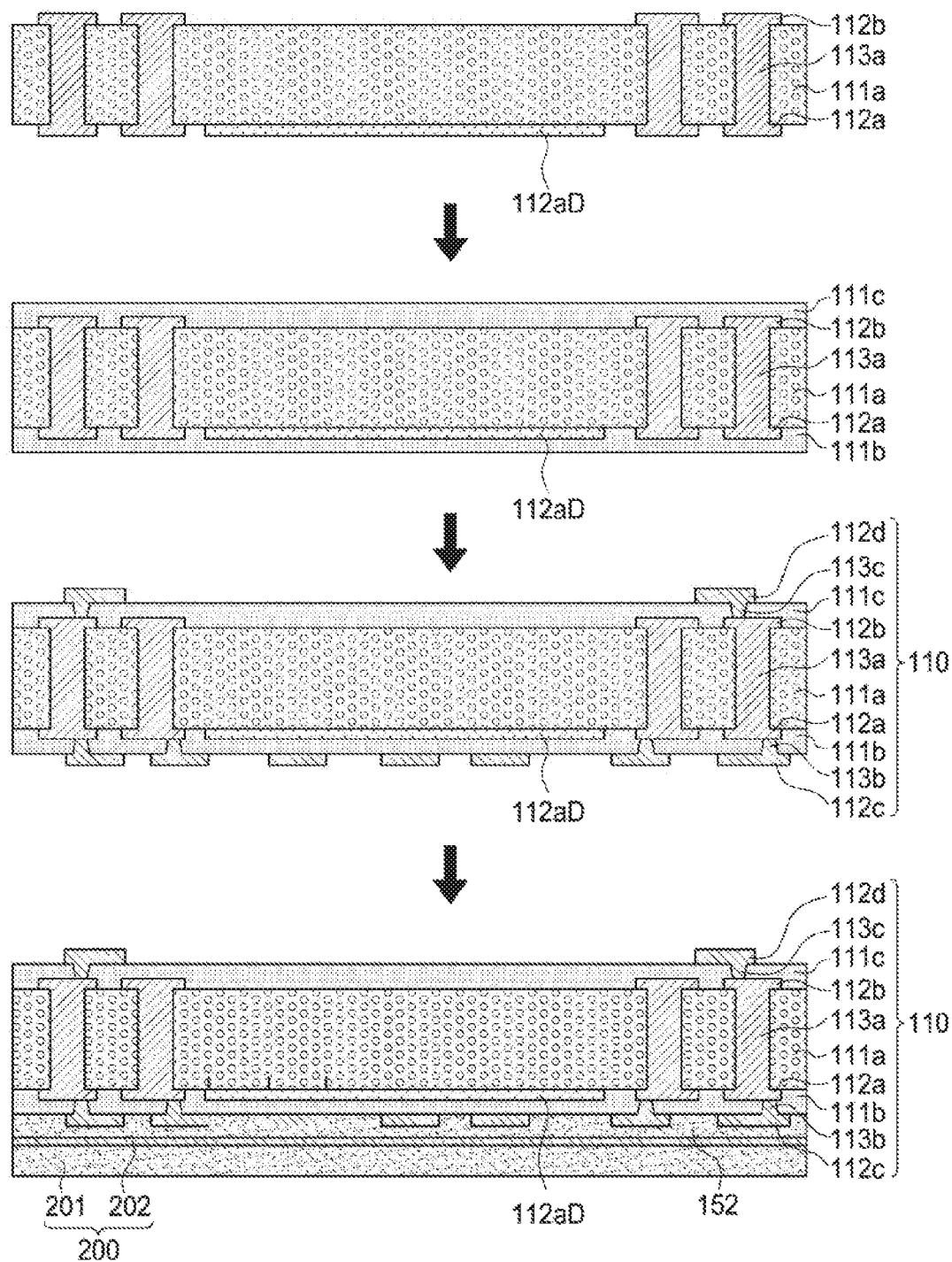
FIGS. 11A through 11D are schematic views illustrating processes of manufacturing the fan-out semiconductor package of FIG. 9.

First, referring to FIG. 11A, the first insulating layer 111a may be prepared using a copper clad laminate (CCL), or the like, and the first and second wiring layers 112a and 112b and the first connection via layers 113a may be formed on and in the first insulating layer 111a by any suitable plating process. Via holes for the first connection via layers 113a may be formed using a mechanical drill, a laser drill, or the like. In addition, the stopper layer 112aD may be formed by laminating the DFR, or the like, on the first insulating layer 111a, and then patterning the DFR. Then, the second and third insulating layers 111b and 111c may be formed on opposite surfaces of the first insulating layer 111a, respectively. The second and third insulating layers 111b and 111c may be formed by laminating and then hardening an ABF, or the like. Then, the third and fourth wiring layers 112c and 112d and the second and third connection via layers 113b and 113c may be formed on and in the second and third insulating layers 111b and 111c, respectively, by any known plating process. Via holes for the second and third connection via layers 113b and 113c may also be formed using a mechanical drill, a laser drill, or the like. The second passivation layer 152 may be attached to a first surface of the frame 110 prepared by a series of processes, and a carrier film 200 such as a DCF, including an insulating layer 201 and a metal layer 202 may be attached to the second passivation layer 152. The second passivation layer 152 may be introduced using a GCP material, but is not limited thereto.

Figure 11B:
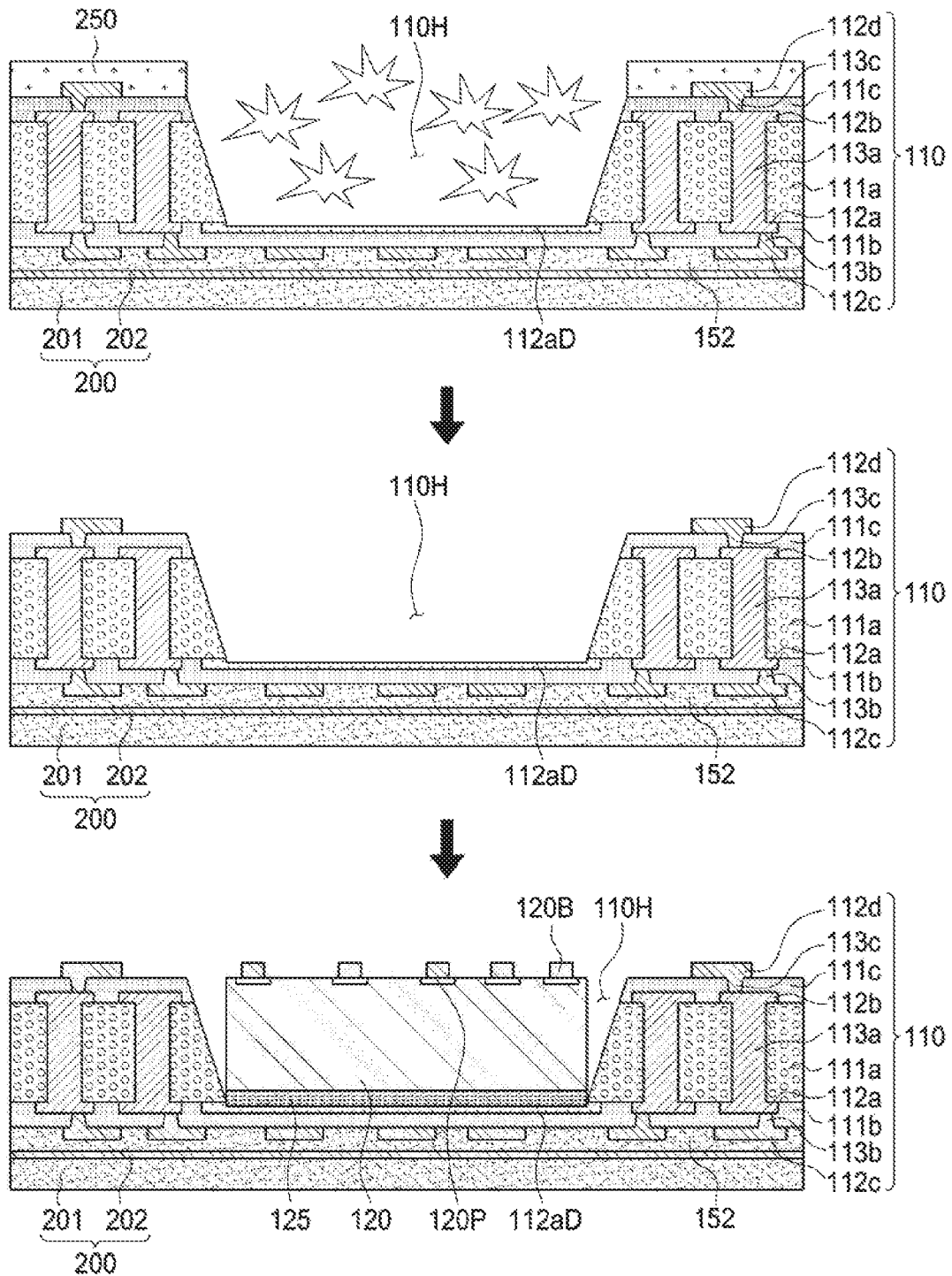

Then, referring to FIG. 11B, a guide layer 250 such as a DFR may be attached to the other surface of the frame 110, and the recess portion 110H penetrating through the first and third insulating layers 111a and 111c may be formed by a sandblasting process. In this case, the stopper layer 112aD may serve as a stopper, and the guide layer 250 may serve as a guide. Since the DFR, or the like, used as the stopper layer 112aD and the guide layer 250 has a very low etching rate, a process margin may be improved in the sandblasting process. The formed recess portion 110H may have a tapered shape. After the recess portion 110H is formed, the guide layer 250 may be removed, and the semiconductor chip 120 may be disposed in the recess portion 110H so that the inactive surface is attached to the stopper layer 112aD. Any known adhesive member 125 such as a DAF may be used to attach the inactive surface to the stopper layer 112aD. Meanwhile, the semiconductor chip 120 may be attached in a state in which the bumps 120B such as copper (Cu) pillars are formed on the connection pads 120P.

Figure 11C:
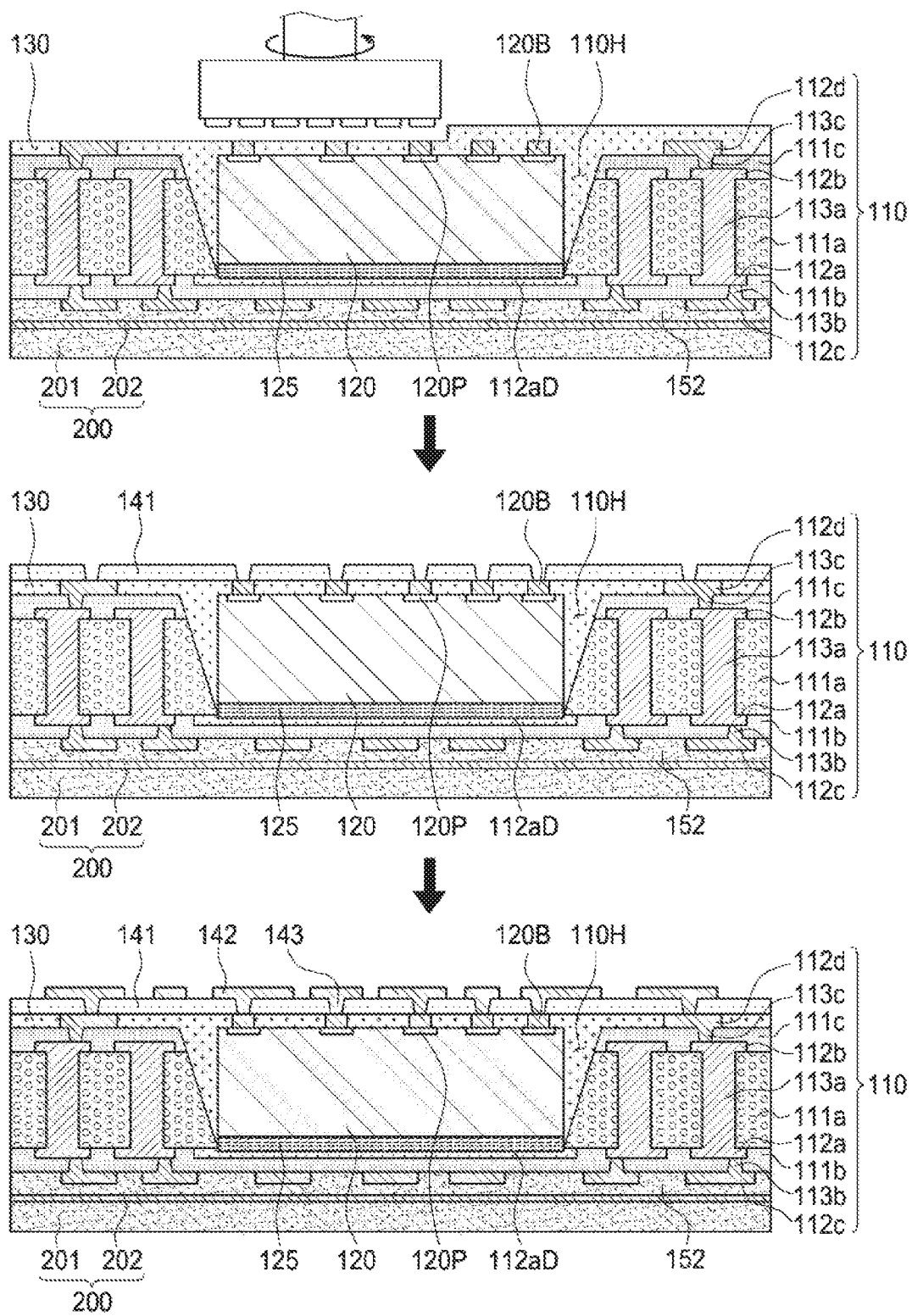

Then, referring to FIG. 11C, at least portions of the frame 110 and the semiconductor chip 120 may be encapsulated using the encapsulant 130. The encapsulants 130 may be formed by laminating and then hardening ABFs, or the like. Then, the encapsulant 130 may be grinded so that the surface of the fourth wiring layer 112d and the surfaces of the bumps 120B are exposed. A surface of the encapsulant 130 may become flat by the grinding, and the surfaces of the bumps 120B and the surface of the fourth wiring layer 112d may be exposed from the encapsulant 130. Then, a PID may be applied to the encapsulant 130 and be then hardened to form the insulating layer 141, and the redistribution layer 142 and the connection vias 143 may be formed on and in the insulating layer 141 by a plating process.

Figure 11D:
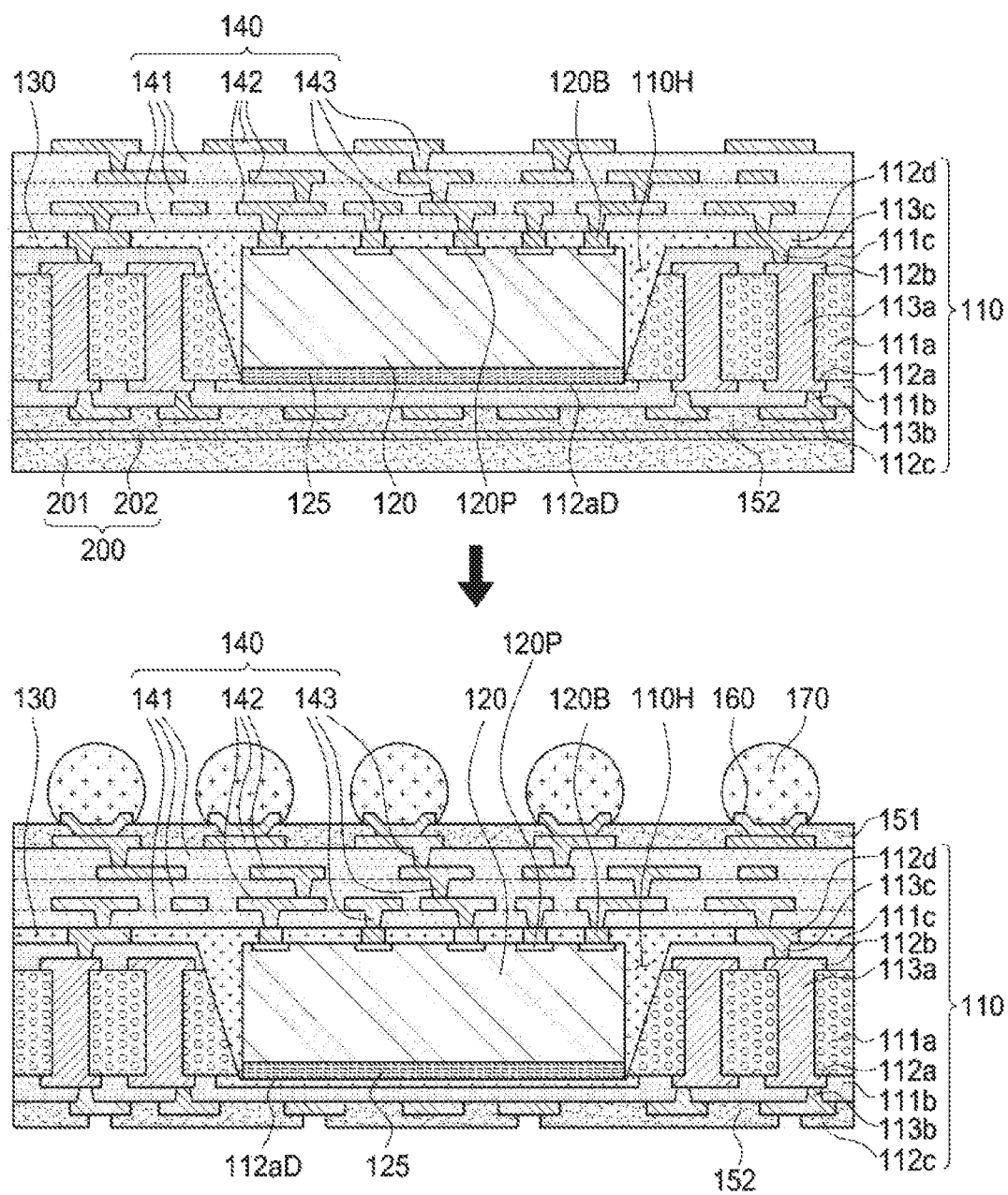

Referring to FIG. 11D larger numbers of insulating layers 141, redistribution layers 142, and connection vias 143 may be formed depending on a design. The connection member 140 may be formed by a series of processes. Then, the first passivation layer 151 may be formed on the connection member 140 by laminating and then hardening an ABF, or the like, and the carrier film 200 may be removed. Then, the underbump metal layers 160 may be formed by any known metallization method, and the electrical connection structures 170 may be formed by a reflow process using solder balls, or the like. The fan-out semiconductor package 100A according to the exemplary embodiment may be manufactured by a series of processes.

Figure 12:
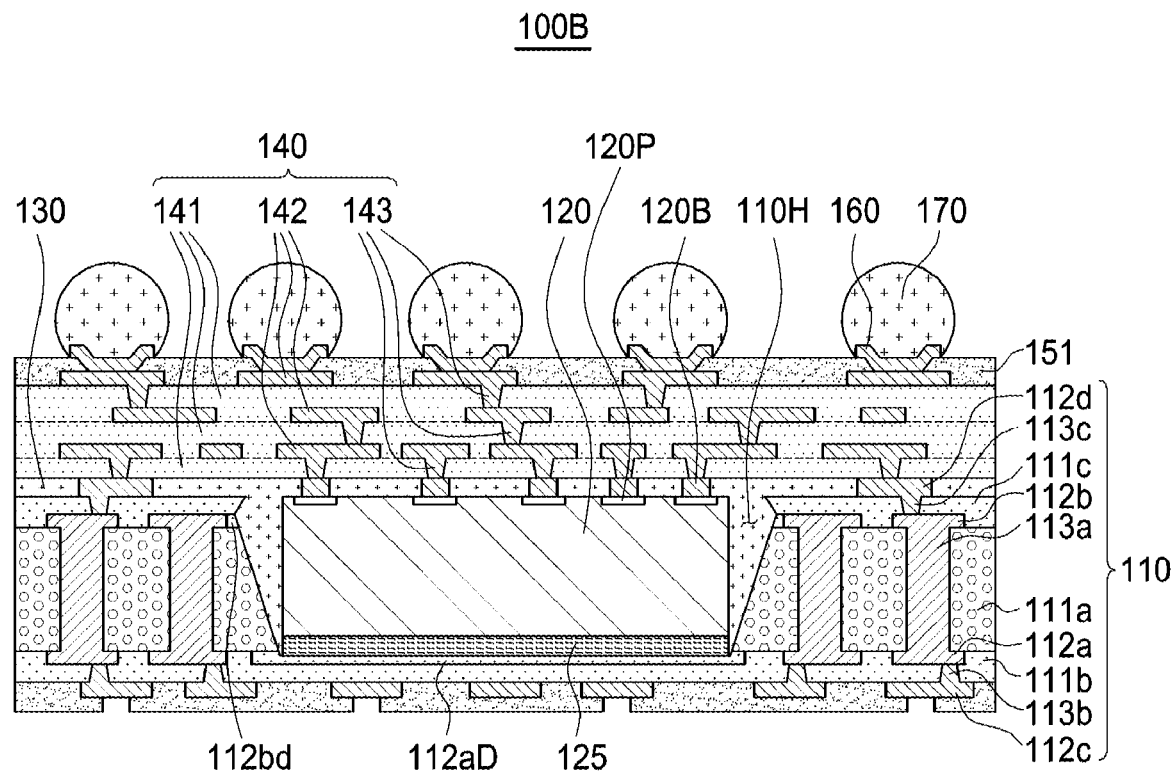
FIG. 12 is a schematic cross-sectional view illustrating another example of a fan-out semiconductor package.

FIG. 12 is a schematic cross-sectional view illustrating another example of a fan-out semiconductor package.

Figure 13:
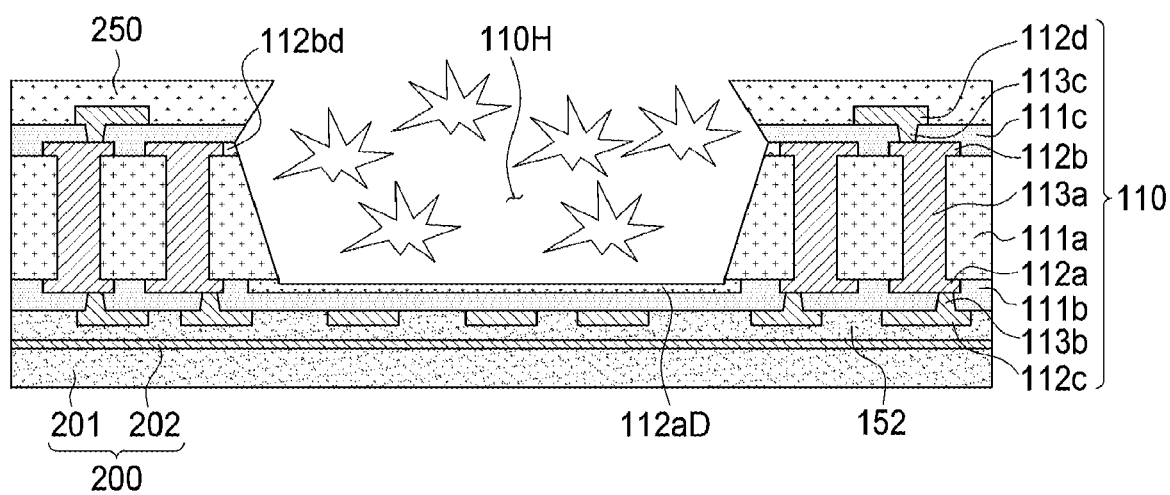
FIG. 13 is a schematic cross-sectional view illustrating a process of forming a recess portion of the fan-out semiconductor package of FIG. 12.

FIG. 13 is a schematic cross-sectional view illustrating a process of forming a recess portion of the fan-out semiconductor package of FIG. 12.

Referring to FIGS. 12 and 13, in a fan-out semiconductor package 100B according to another exemplary embodiment in the present disclosure, a frame 110 may further include a guide layer 112bd disposed on a second surface of a first insulating layer 111a. The guide layer 112bd may be covered by the third insulating layer 111c, and at least portions of side surfaces of the guide layer 112bd may be exposed. The guide layer 112bd may also include a material having an etching rate lower than that of a metal such as copper (Cu) in a sandblasting process. For example, the guide layer 112bd may also include an insulating material. In more detail, the guide layer 112bd may also be, for example, a DFR including a photosensitive polymer, but is not limited thereto. In this case, walls of a recess portion 110H formed in the first insulating layer 111a may have a first gradient, walls of the recess portion 110H formed in the third insulating layer 111c may have a second gradient, and directions of the first and second gradients may be opposite to each other in relation to the exposed side surfaces of the guide layer 112bd. As described above, when the guide layer 112bd is introduced, a shape of the recess portion 110H may be controlled. Other contents overlap those described above, and a detailed description thereof is thus omitted.

Figure 14:
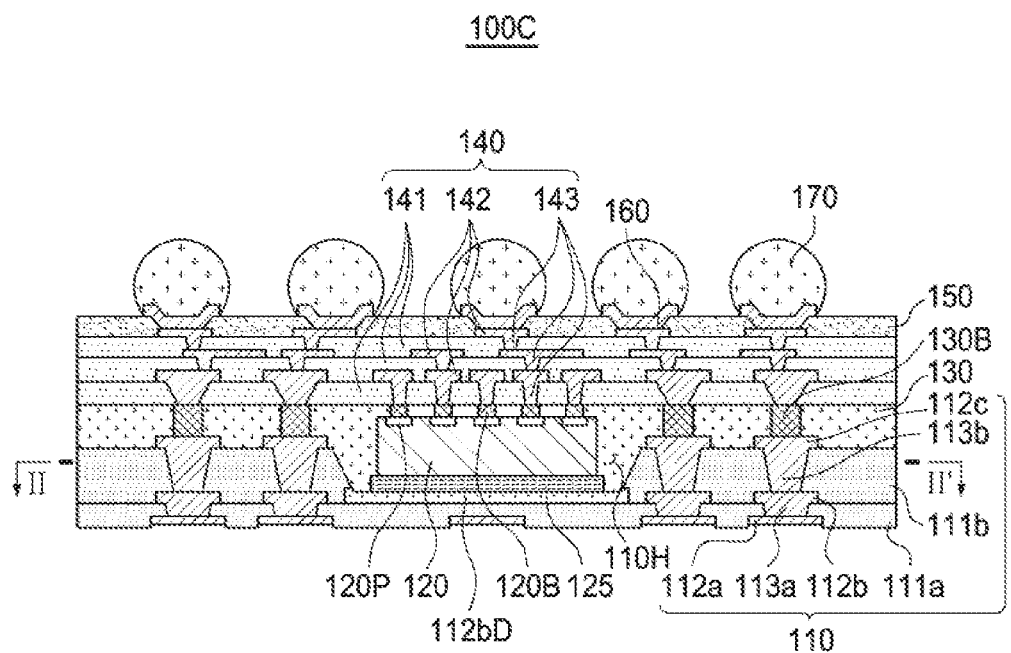
FIG. 14 is a schematic cross-sectional view illustrating another example of a fan-out semiconductor package.

FIG. 14 is a schematic cross-sectional view illustrating another example of a fan-out semiconductor package.

Figure 15:
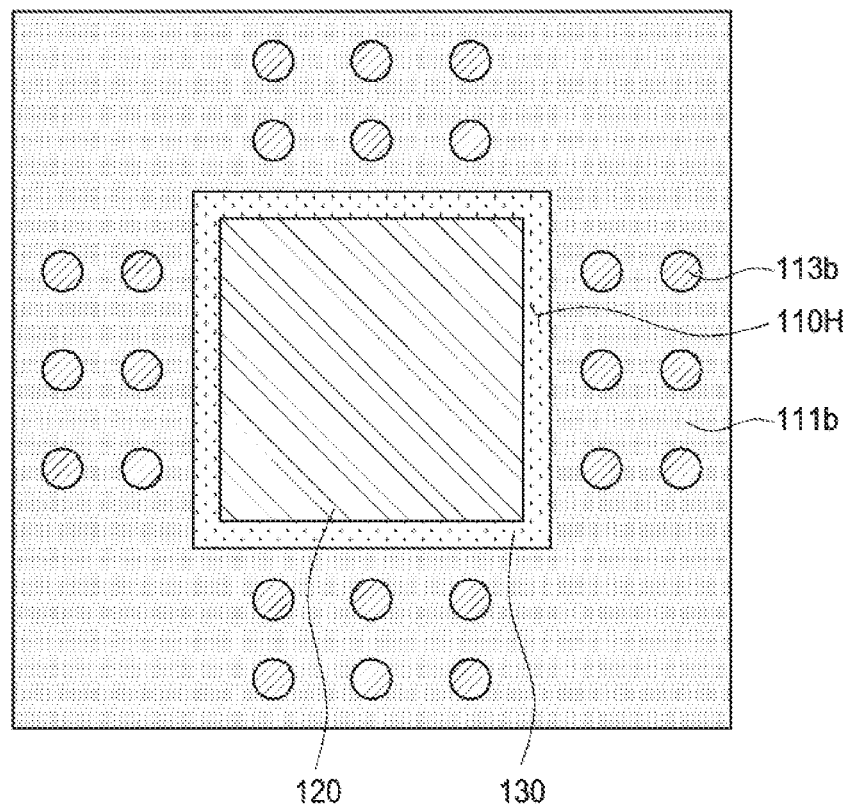
FIG. 15 is a schematic plan view taken along line II-II' of the fan-out semiconductor package of FIG. 14.

FIG. 15 is a schematic plan view taken along line II-II' of the fan-out semiconductor package of FIG. 14.

Referring to FIGS. 14 and 15, a fan-out semiconductor package 100C according to another exemplary embodiment in the present disclosure may include a frame 110 having a recess portion 110H having a blind form of which a first surface is covered with a stopper layer 112bD and a second surface opposing the first surface is opened, a semiconductor chip 120 having an active surface having connection pads 120P disposed thereon and an inactive surface opposing the active surface and disposed in the recess portion 110H so that the inactive surface is attached to the stopper layer 112bD, an encapsulant 130 encapsulating at least portions of each of the frame 110 and the semiconductor chip 120 and filling at least portions of the recess portion 110H, and a connection member 140 disposed on the frame 110, the encapsulant 130, and the active surface of the semiconductor chip 120. In addition, the fan-out semiconductor package 100C according to another exemplary embodiment may further include a passivation layer 150 disposed on the connection member 140 and having openings exposing at least portions of a redistribution layer 142 of the connection member 140, underbump metal layers 160 disposed in the openings of the passivation layer 150 and electrically connected to the exposed redistribution layer 142, and electrical connection structures 170 disposed on the underbump metal layers 160 and electrically connected to the exposed redistribution layer 142 through the underbump metal layers 160. Bumps 120B and 130B such as copper (Cu) posts may be formed on the connection pads 120P and a wiring layer 112c, respectively, and may be encapsulated with the encapsulant 130. Surfaces of the bumps 120B and 130B in contact with the connection member 140 may be disposed on a level that is substantially the same as that a surface of the encapsulant 130 in contact with the connection member 140, by a grinding process to be described below.

The frame 110 may include a first insulating layer 111a, a first wiring layer 112a embedded in the first insulating layer 111a so that one surface thereof is exposed, a second wiring layer 112b disposed on the other surface of the first insulating layer 111a opposing one surface of the first insulating layer 111a in which the first wiring layer 112a is embedded, a second insulating layer 111b disposed on the first insulating layer 111a and covering the second wiring layer 112b, and a third wiring layer 112c disposed on the second insulating layer 111b. The first to third wiring layers 112a, 112b, and 112c may be electrically connected to each other through first and second connection via layers 113a and 113b each penetrating through the first and second insulating layers 111a and 111b, and may be electrically connected to the connection pads 120 through the redistribution layers 142, or the like. The first and second connection via layers 113a and 113b may have tapered shapes of which directions are the same as each other. The first to third wiring layers 112a, 112b, and 112c may have thicknesses greater than those of the redistribution layers 142 for a similar reason. Exposed one surface of the first wiring layer 112a and one surface of the first insulating layer 111a exposing the first wiring layer 112a may have a step therebetween for a reason of a process to be described below.

The stopper layer 112bD may be disposed on the other surface of the first insulating layer 111a opposing one surface of the first insulating layer 111a in which the first wiring layer 112a is embedded. An edge region of the stopper layer 112bD may be covered with the second insulating layer 111b, and at least portions of a surface of the stopper layer 112bD except for the edge region may be exposed by the recess portion 110H. The recess portion 110H may penetrate through the second insulating layer 111b, but may not penetrate through the first insulating layer 111a. Walls of the recess portion 110H formed in the second insulating layer 111b may have a gradient. Likewise, the stopper layer 112bD may include a material having a low etching rate, for example, an insulating material, more specifically, a photosensitive polymer such as a DFR, but is not limited thereto. The edge region of the stopper layer 112bD covered with the second insulating layer 111b may have a thickness greater than that of a region of the stopper layer 112bD exposed from the second insulating layer 111b by the recess portion 110H. The reason is that portions of the surface may be removed in a sandblasting process.

Meanwhile, an embedded trace substrate (ETS) process to be described below may be required in order to manufacture the fan-out semiconductor package 100C according to another exemplary embodiment into which a frame 110 having an embedded pattern 112a and a blind recess portion 110H is introduced. In this case, since a carrier substrate 200 is used from when the frame 110 is manufactured until when the connection member 140 is formed, warpage of the fan-out semiconductor package 100C may be efficiently controlled in all of process of manufacturing the fan-out semiconductor package 100C, and a separate carrier need not be additionally attached in an intermediate process, such that a cost required for manufacturing the fan-out semiconductor package 100C may be decreased. In addition, when the embedded pattern 112a is disposed on a level different from that of the stopper layer 112bD for forming the blind recess portion 110H, that is, when the embedded pattern 112a is disposed on a level below the stopper layer 112bD, the embedded pattern 112a itself may become a backside wiring layer in relation to the semiconductor chip 120, and the backside wiring layer may thus be easily introduced. Other contents overlap those described above, and a detailed description thereof is thus omitted.

Figure 16A:
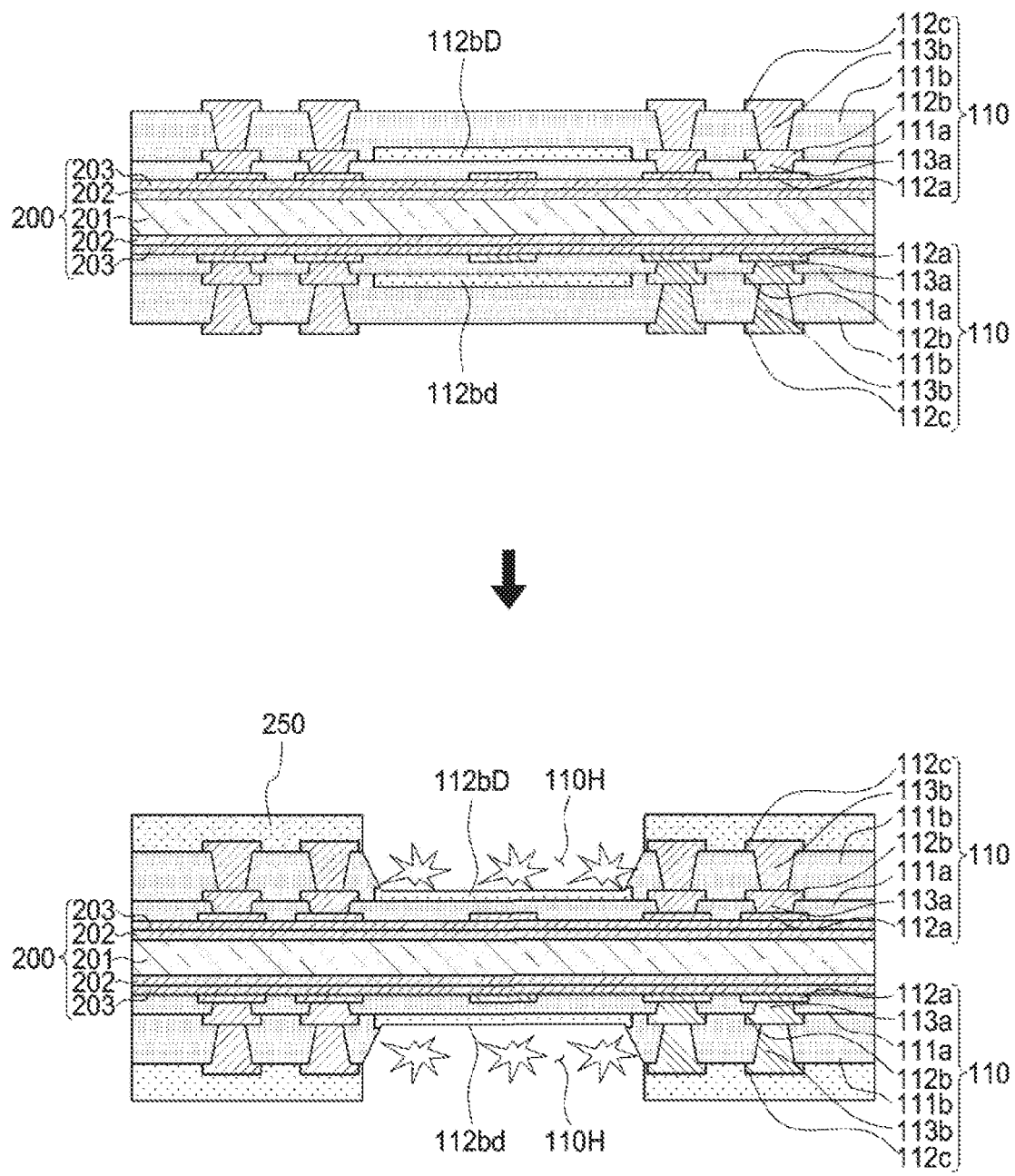
FIGS. 16A through 16C are schematic views illustrating processes of manufacturing the fan-out semiconductor package of FIG. 14.
Figure 16B:
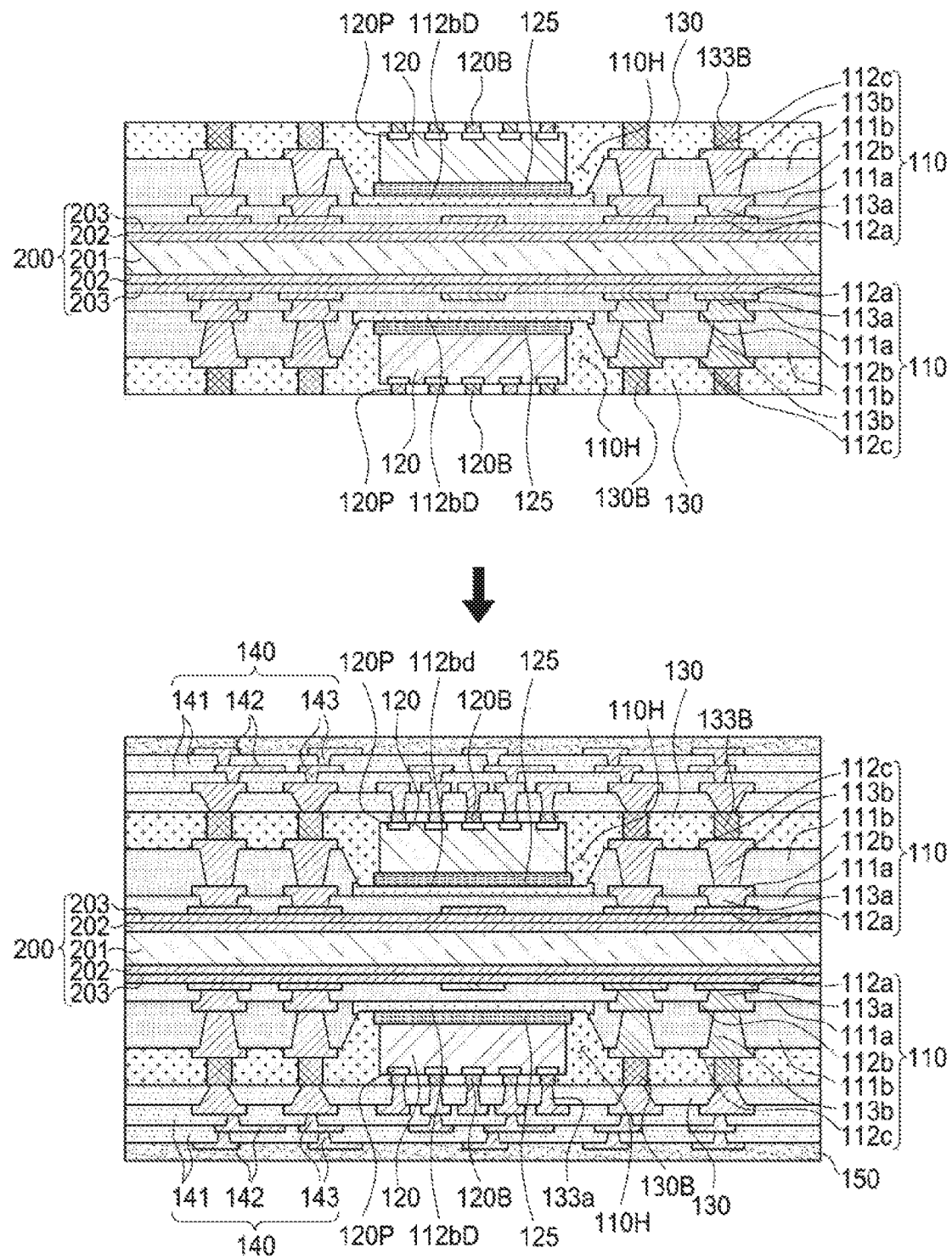
Figure 16C:
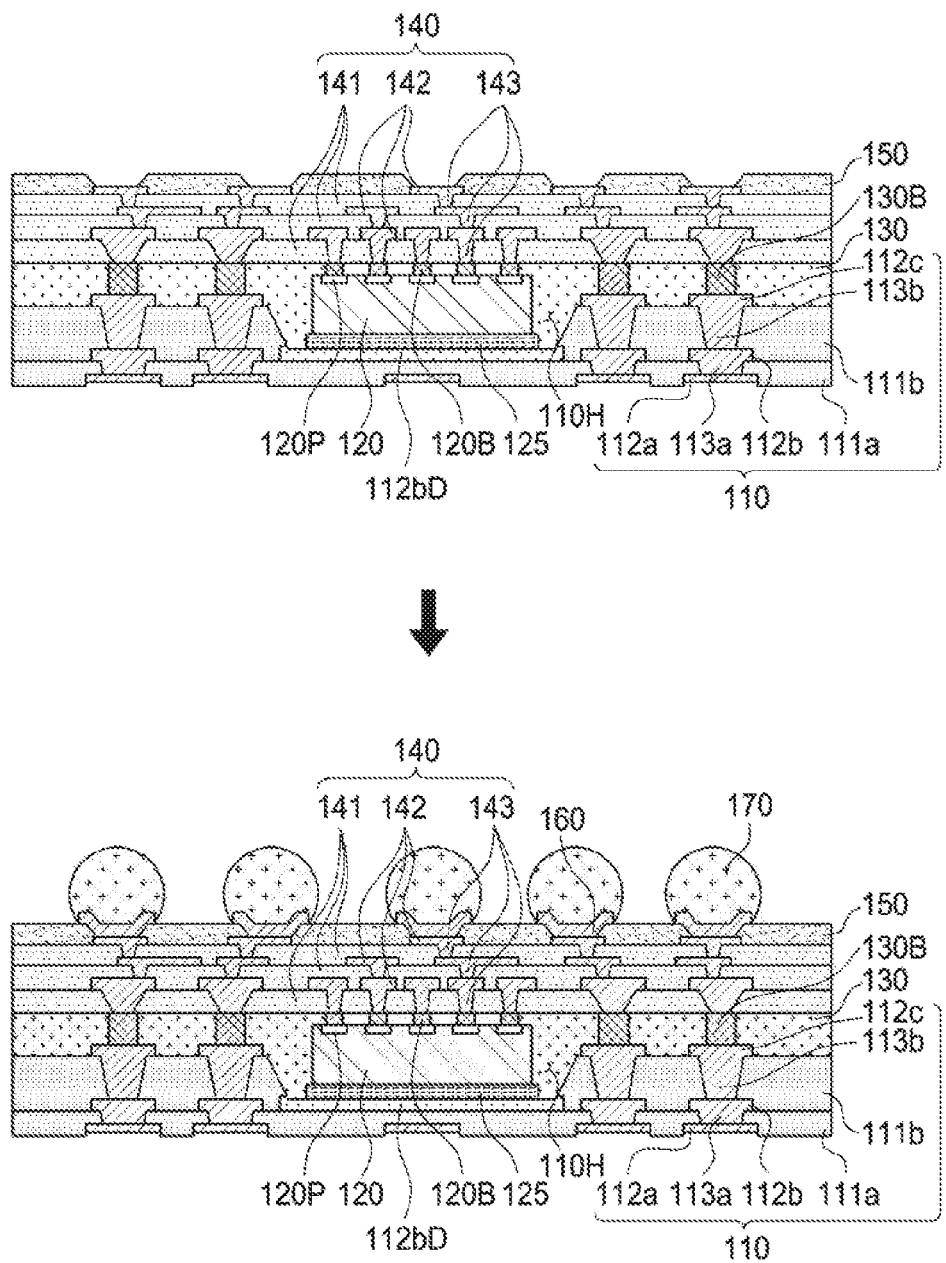

FIGS. 16A through 16C are schematic views illustrating processes of manufacturing the fan-out semiconductor package of FIG. 14.

Referring to FIG. 16A, the frame 110 may be formed using a carrier substrate 200 in which a plurality of metal layers 202 and 203 are disposed on each of opposite surfaces of an insulating layer 201. In detail, the first wiring layers 112a may be formed on opposite surfaces of the carrier substrate 200 by a plating process using outer metal layers 203 of the carrier substrate 200 as seed layers, the first wiring layers 112a may be covered with the first insulating layers 111a, via holes penetrating through the first insulating layers 111a may be formed using a laser drill, or the like, and the second wiring layers 112b and the first connection via layers 113a may be formed by any suitable plating process. In addition, the stopper layers 112bD may be formed by laminating and then patterning DFRs. Then, the second insulating layers 111b may be formed on the first insulating layers 111a, via holes penetrating through the second insulating layers 111b may be formed using a laser drill, or the like, and the third wiring layers 112c and the second connection via layers 113b may be formed by any suitable plating process. Then, guide layers 250 such as DFRs, or the like, may be patterned on and attached to the second insulating layers 112b, and the recess portions 110H penetrating through the second insulating layers 111b may be formed by a sandblasting process. In this case, the stopper layers 112bD may serve as stoppers. The formed recess portions 110H may have the tapered shape. After the recess portions 110H are formed, the guide layers 250 may be removed.

Then, referring to FIG. 16B, the semiconductor chips 120 may be disposed in the recess portions 110H so that the inactive surfaces are attached to the stopper layers 112bD. Any suitable adhesive members 125 such as DAFs may be used to attach the inactive surfaces to the stopper layers 112bD. Meanwhile, the bumps 120B may be formed on the connection pads 120P of the semiconductor chips 120. The bumps 130B such as the copper posts may be formed on the third wiring layers 112c of the frames 110. Then, at least portions of the frames 110 and the semiconductor chips 120 may be encapsulated using the encapsulants 130. The encapsulants 130 may be formed by laminating and then hardening ABFs, or the like. Then, a grinding process may be performed to make one surfaces of the encapsulants 130 and one surfaces of the bumps 120B and 130B flat to be disposed on the same level. Then, PIDs may be applied to the encapsulants 130 and be then hardened to form the insulating layers 141, and the redistribution layers 142 and the connection vias 143 may be formed on and in the insulating layers 141 by a plating process. In this case, via holes may be formed by a photolithography method using exposure and development. Then, the passivation layers 150 may be formed on the connection members 140 by laminating and then hardening ABFs, or the like.

Then, referring to FIG. 16C, precursors of manufactured packages may be separated from the carrier substrate 200. The separation may be performed by a process of separating the metal layers 202 and 203 from each other. The outer metal layer 203 remaining below of the first insulating layer 111a may be removed by an etching process. In this case, a step may be generated between the lower surface of the first insulating layer 111a and a lower surface of the first wiring layer 112a. Then, if necessary, the openings may be formed in the passivation layer 150, the underbump metal layers 160 may be formed in the openings by any known metallization method, and the electrical connection structures 170 may be formed by a reflow process using solder balls, or the like. The underbump metal layers 160 and the electrical connection structures 170 may also be manufactured in a state in which they are attached to the carrier substrate 200. The fan-out semiconductor package 100C according to the exemplary embodiment may be manufactured by a series of processes.

As set forth above, according to the exemplary embodiments in the present disclosure, a fan-out semiconductor package in which a frame having a blind recess portion is introduced, a semiconductor chip is disposed in the frame, and gradients of walls of the recess portion are controlled to optimize a process may be provided.

While exemplary embodiments have been shown and described above, it will be apparent to those skilled in the art that modifications and variations could be made without departing from the scope of the present invention as defined by the appended claims.

What is claimed is:

1. A method of manufacturing a semiconductor package, comprising:
preparing a frame including a core insulating layer, one or more first build-up insulating layers disposed on an upper surface of the core insulating layer, a plurality of wiring layers disposed on each of the core insulating layer and the one or more first build-up insulating layers, and a stopper layer disposed on a lower surface of the core insulating layer;
forming a recess portion penetrating through the core insulating layer and a first build-up insulating layer from among the one or more first build-up insulating layers and exposing at least a portion of the stopper layer;
disposing a semiconductor chip in the recess portion so that an inactive surface of the semiconductor chip is attached to the stopper layer;
forming an encapsulant covering at least portions of the semiconductor chip and the frame and filling at least portions of the recess portion; and
forming a connection member disposed on the frame and an active surface of the semiconductor chip, the connection member including a redistribution layer electrically connecting the plurality of wiring layers of the frame and connection pads on the active surface of the semiconductor chip to each other,
wherein the stopper layer includes an insulating material, and
wherein a region of the stopper layer exposed by the recess portion has a thickness smaller than that of an edge region of the stopper layer that is not exposed.

2. The method of claim 1, wherein the forming the recess portion is executed by a sandblasting process.

3. The method of claim 1, wherein the forming the recess portion is executed so that the recess portion has a tapered shape.

4. The method of claim 1, wherein the stopper layer and at least a portion of the plurality of wiring layers are located at a same level.

5. The method of claim 1, wherein the stopper layer has a planar area greater than that of the inactive surface of the semiconductor chip.

6. The method of claim 1, wherein a bottom surface of the recess portion has a planar area greater than that of the inactive surface of the semiconductor chip.

7. The method of claim 1, wherein the insulating material of the stopper layer includes a photosensitive polymer.

8. The method of claim 1, wherein the stopper layer includes a dry film photo-resist (DFR).

9. The method of claim 1, wherein the inactive surface of the semiconductor chip is attached to the stopper layer by an adhesive member.

10. The method of claim 1, further comprising grinding the encapsulant after the forming the encapsulant so that an upper surface of metal bumps disposed on the connection pads of the semiconductor chip and an upper surface of an uppermost wiring layer of the plurality of wiring layers of the frame are exposed.

11. The method of claim 10, wherein an upper surface of the encapsulant is coplanar with the upper surface of the metal bumps and the upper surface of the uppermost wiring layer of the plurality of wiring layers.

12. A method of manufacturing a semiconductor package, comprising:
preparing a frame including a core insulating layer, one or more first build-up insulating layers disposed on an upper surface of the core insulating layer, a plurality of wiring layers disposed on each of the core insulating layer and the one or more first build-up insulating layers, and a stopper layer disposed on a lower surface of the core insulating layer;
forming a recess portion penetrating through the core insulating layer and a first build-up insulating layer from among the one or more first build-up insulating layers and exposing at least a portion of the stopper layer;
disposing a semiconductor chip in the recess portion so that an inactive surface of the semiconductor chip faces a bottom surface of the recess portion, the semiconductor chip has the inactive surface and an active surface, opposing to the inactive surface, on which metal bumps are disposed;
forming an encapsulant covering at least portions of the semiconductor chip and filling at least portions of the recess portion;
forming a planarized surface by grinding a portion of the encapsulant so that upper surfaces of each of the metal bumps and an upper surface of an uppermost wiring layer of the plurality of wiring layers of the frame are exposed; and
forming a connection member disposed on the planarized surface.

13. The method of claim 12, the forming the recess portion is executed so that the recess portion has a tapered shape.

14. The method of claim 12, wherein an insulating material of the stopper layer includes a photosensitive polymer.

15. The method of claim 12, wherein the stopper layer includes a dry film photo-resist (DFR).

* * * * *